US010123456B2

(12) United States Patent
Evans et al.

(10) Patent No.: US 10,123,456 B2
(45) Date of Patent: Nov. 6, 2018

(54) PHASE CHANGE MATERIAL HEAT SINK USING ADDITIVE MANUFACTURING AND METHOD

(71) Applicant: Raytheon Company, Waltham, MA (US)

(72) Inventors: Jeremy T. Evans, Tucson, AZ (US); Adam C. Wood, Oro Valley, AZ (US); Chad E. Boyack, Tucson, AZ (US); Richard Piekarski, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 140 days.

(21) Appl. No.: 14/925,737

(22) Filed: Oct. 28, 2015

(65) Prior Publication Data

US 2017/0127557 A1     May 4, 2017

(51) Int. Cl.
*B23P 15/26*     (2006.01)
*H05K 7/20*     (2006.01)

(52) U.S. Cl.
CPC ............ *H05K 7/2029* (2013.01); *B23P 15/26* (2013.01)

(58) Field of Classification Search
CPC ............ H05K 7/2029; H05K 7/20309; H05K 7/20318; B23P 15/26; B23P 2700/10; B21D 53/02; B33Y 99/00; F28D 2021/0028; F28D 2021/0029; Y10T 29/49366; Y10T 29/49368; B29C 73/06; B29C 73/063
See application file for complete search history.

(56) References Cited

U.S. PATENT DOCUMENTS

| | | |
|---|---|---|
| 3,519,067 A | 7/1970 | Schmidt |
| 4,259,401 A | 3/1981 | Chahroudi et al. |
| 4,928,448 A | 5/1990 | Phillip |
| 5,788,178 A | 8/1998 | Barrett, Jr. |
| 5,792,390 A * | 8/1998 | Marino ............... F24F 6/00 215/359 |
| 6,474,593 B1 | 11/2002 | Lipeies et al. |
| 6,959,753 B1 | 11/2005 | Weber et al. |
| 7,069,975 B1 | 7/2006 | Haws et al. |
| 7,416,017 B2 | 8/2008 | Haws et al. |
| 7,628,352 B1 | 12/2009 | Low et al. |
| 7,781,709 B1 | 8/2010 | Jones et al. |
| 7,810,552 B2 * | 10/2010 | Slaughter ............ B22F 3/1055 165/148 |

(Continued)

FOREIGN PATENT DOCUMENTS

| | | | |
|---|---|---|---|
| EP | 0732743 A2 * | 9/1996 | ............ F28D 20/02 |
| GB | 2474578 A | 4/2011 | |

(Continued)

OTHER PUBLICATIONS

"Pressure Loss and Heat Transfer through Heat Sinks produced by Selective Laser Melting"—Wong (pp. 1069-1070).*

(Continued)

*Primary Examiner* — Jason L Vaughan
*Assistant Examiner* — Amanda Meneghini

(57) ABSTRACT

A heat sink is provided that includes a lower shell, an upper shell and an internal matrix. The lower shell, the upper shell and the internal matrix are formed as a single component using additive manufacturing techniques. The internal matrix includes a space that is configured to receive a phase change material.

21 Claims, 4 Drawing Sheets

(56) References Cited

U.S. PATENT DOCUMENTS

| | | |
|---|---|---|
| 7,834,301 B2 | 11/2010 | Clingman |
| 7,891,298 B2 | 2/2011 | Minick et al. |
| 7,999,212 B1 | 8/2011 | Thiesen et al. |
| 8,534,348 B2 * | 9/2013 | Ohsawa ................. B23P 15/26 165/104.26 |
| 2002/0033247 A1 | 3/2002 | Neuschutz |
| 2009/0040726 A1 | 2/2009 | Hoffman |
| 2010/0147152 A1 | 6/2010 | Kosugi |
| 2011/0284188 A1 | 11/2011 | Cai |
| 2012/0240919 A1 | 9/2012 | Baumann |
| 2014/0030575 A1 * | 1/2014 | Kim ................... H05K 7/20436 429/120 |
| 2016/0209128 A1 * | 7/2016 | Stieber ....................... F28F 3/00 |

FOREIGN PATENT DOCUMENTS

| | | |
|---|---|---|
| WO | 2008/044256 A1 | 4/2008 |
| WO | 2011/046940 A1 | 4/2011 |

OTHER PUBLICATIONS

"3D Printing", Wikipedia, Oct. 28, 2015, 35 pages.
International Search Report and Written Opinion dated Apr. 30, 2015 in connection with International Application PCT/US2015/014045; 10 pages.
"M982 Excalibur"; retrieved from http://en.wikipedia.org/w/index.php?title=Excalibur&oldid=638243770; Dec. 15, 2014, 8 pages.
"Extreme Accuracy Tasked Ordnance (EXACTO)"; retrieved from http://www.darpa.mil/Our_Work/TTO/Programs/Extreme_Accuracy_Tasked_Ordnance_%28EXACTO%29.aspx; Jul. 2015, 2 pages.
"EXACTO Demonstrates First-Ever Guided .50 Caliber Bullets"; retrieved from http://www.darpa.mil/ NewsEvents/Releases/2014/07/10a.aspx; Jul. 10, 2014; 2 pages.
"Sandia's Self-Guided Bullet Prototype Can Hit Target a Mile Away"; Sandia Labs News Release; Jan. 30, 2012; 3 pages.

* cited by examiner

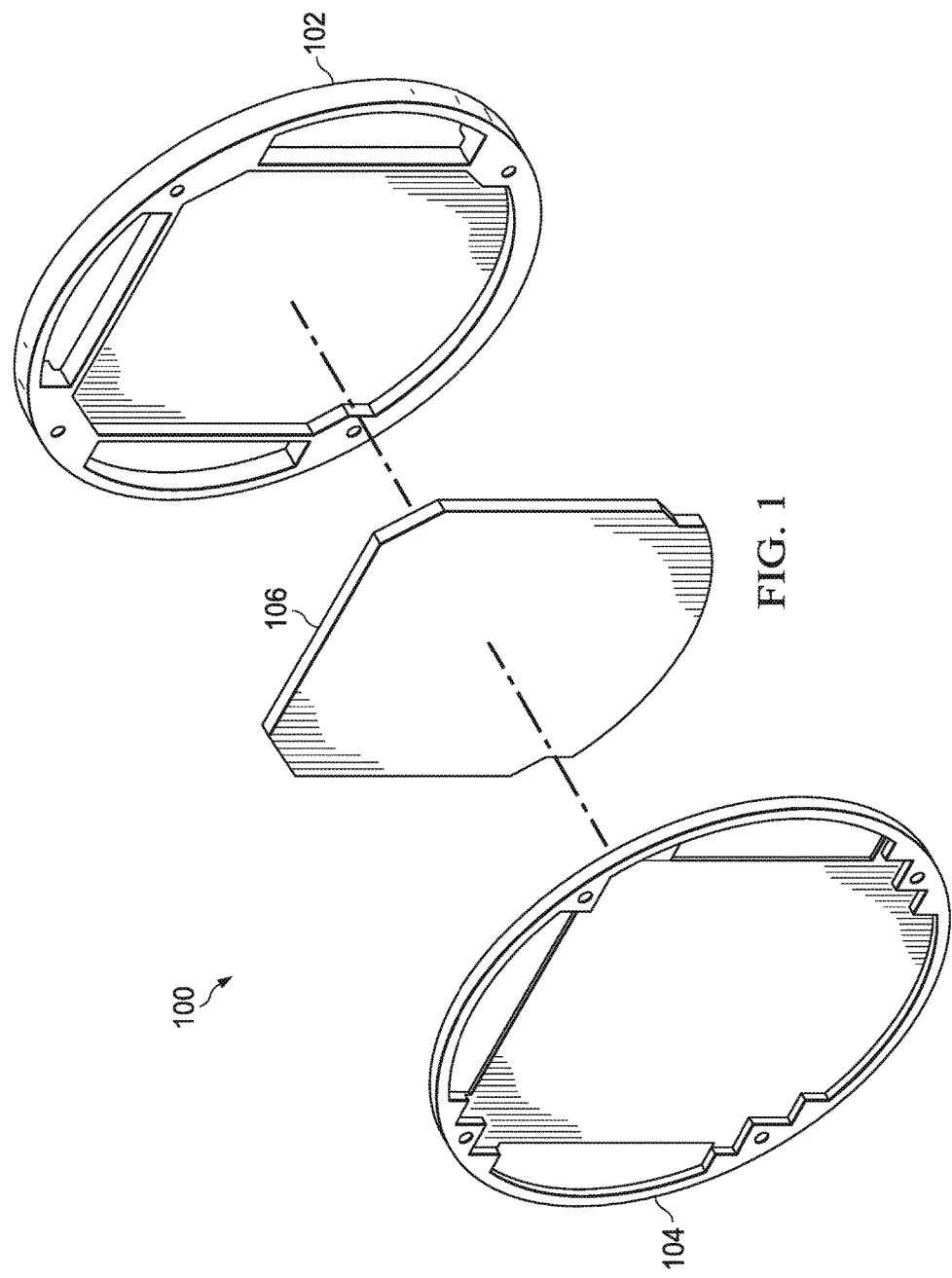

PHASE CHANGE MATERIAL HEAT SINK USING ADDITIVE MANUFACTURING AND METHOD

TECHNICAL FIELD

The present disclosure is directed, in general, to thermal technology and, more specifically, to a phase change material heat sink using additive manufacturing and method.

BACKGROUND OF THE DISCLOSURE

Phase change material heat sinks are capable of increasing thermal capacitance per volume/mass as compared to typical metallic heat sinks. Containing the phase change material within a heat sink generally requires sealing that is accomplished by vacuum brazing two metal shells, in addition to brazing an internal metal matrix, such as aluminum foam. However, brazing operations are expensive and provide potential leak paths and fatigue failure points.

SUMMARY OF THE DISCLOSURE

This disclosure provides a phase change material (PCM) heat sink using additive manufacturing and method.

In one embodiment, a heat sink is provided that includes a lower shell, an upper shell and an internal matrix. The lower shell, the upper shell and the internal matrix are formed as a single component using additive manufacturing techniques. The internal matrix includes a space that is configured to receive a phase change material.

In another embodiment, a PCM heat sink is provided that includes a phase change material, a lower shell, an upper shell and an internal matrix. The internal matrix includes a space that is configured to receive the phase change material. The lower shell, the upper shell and the internal matrix are formed as a single component using additive manufacturing techniques.

In yet another embodiment, a method for forming a heat sink is provided. The method includes using additive manufacturing techniques to form a lower shell, an internal matrix and an upper shell of a heat sink. Thus, the lower shell, the upper shell and the internal matrix comprise a single-structure component.

Other technical features may be readily apparent to one skilled in the art from the following figures, descriptions, and claims.

BRIEF DESCRIPTION OF THE DRAWINGS

For a more complete understanding of the present disclosure, reference is now made to the following description taken in conjunction with the accompanying drawings, in which:

FIG. 1 illustrates an expanded view of a heat sink in accordance with the present disclosure;

DETAILED DESCRIPTION

Figure 2A:
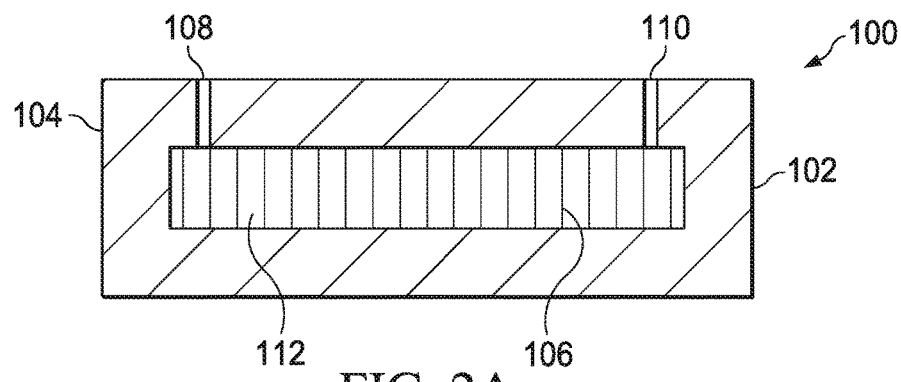
FIGS. 2A-C illustrate cross-sectional views of an example of the formation of a phase change material (PCM) heat sink in accordance with the present disclosure.

FIGS. 1 through 4, discussed below, and the various embodiments used to describe the principles of the present disclosure in this patent document are by way of illustration only and should not be construed in any way to limit the scope of the disclosure. Those skilled in the art will understand that the principles of the present disclosure may be implemented using any number of techniques, whether currently known or not. Additionally, the drawings are not necessarily drawn to scale.

As described above, containing a phase change material (PCM) within a heat sink generally requires sealing that is most effectively accomplished by creating a pressure vessel to contain the PCM. For example, paraffin wax is sealed in an aluminum container to form one type of PCM heat sink that typically uses vacuum brazing to prevent the paraffin wax from escaping the heat sink when it expands as a liquid. Vacuum brazing is performed at a limited number of facilities and typically has a multi-month lead time.

FIG. 1 illustrates an expanded view of a heat sink 100 in accordance with the present disclosure. The embodiment of the heat sink 100 shown in FIG. 1 is for illustration only. Other embodiments of the heat sink 100 could be used without departing from the scope of this disclosure.

The heat sink 100 comprises a lower shell 102, an upper shell 104 and an internal matrix 106. As described in more detail below, a phase change material (not shown in FIG. 1) is incorporated into the heat sink 100 to generate a phase change material (PCM) heat sink. The heat sink 100 may comprise aluminum or any other suitable thermally-conductive material. Although illustrated as circular, it will be understood that the heat sink 100 may comprise any suitable shape, such as oval, rectangular, triangular, configured to be adjacent to a printed circuit board or the like. In addition, the heat sink 100 may be designed into the structure of any suitable component, eliminating the need to physically attach the heat sink 100 to a component requiring thermal regulation.

As described in more detail below, the internal matrix 106 comprises open space that is configured to accommodate the phase change material. The internal matrix 106 may comprise any suitable form, such as straight, slanted, spiral, zigzag, foam or the like, that includes open space for receiving the phase change material. The internal matrix 106 is configured to conduct thermal energy into the phase change material within the space of the internal matrix 106.

In conventional PCM heat sinks, the lower shell and the upper shell (and often the internal matrix also) are distinct components that are sealed together using vacuum brazing. However, the heat sink 100 of the present disclosure includes the lower shell 102, the upper shell 104 and the internal matrix 106 integrated together as a single component that is generated using additive manufacturing.

As a result, the heat sink 100 is less expensive to produce and more robust than conventional heat sinks. Additive manufacturing also allows for the possibility to generate the lower and upper shells 102 and 104, as well as the internal matrix 106, with more complex designs to address specific issues such as dissipating heat from high power density components. Thus, the design of the internal matrix 106 is not limited to a metal foam or other design that can be formed using traditional machining techniques. For example, a complex internal matrix 106 may be designed to optimize heat transport, maximize volume allocated for phase change material, and provide suitable PCM filling paths. This design may be customized to provide the most efficient removal of heat from a particular application and to optimize heat transfer into the phase change material.

In addition, because the internal matrix 106 is formed together with the shells 102 and 104, good contact with the shells 102 and 104 is inherently designed into the heat sink 100. Finally, instead of being formed separately and later attached to a component, the heat sink 100 may be incorporated into the design of any suitable structural component, thereby increasing heat capacity for the structural component. For example, the structural component may include an airframe, bulkhead or any other suitable component that may be formed using additive manufacturing techniques.

Although FIG. 1 illustrates one example of a heat sink 100, various changes may be made to the embodiment shown in FIG. 1. For example, the makeup and arrangement of the heat sink 100 are for illustration only. Components could be added, omitted, combined, subdivided, or placed in any other suitable configuration according to particular needs.

Figure 2B:
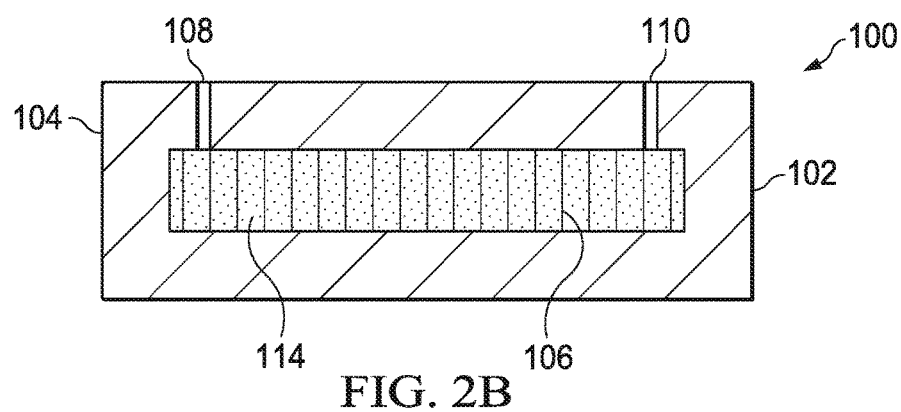
Figure 2C:
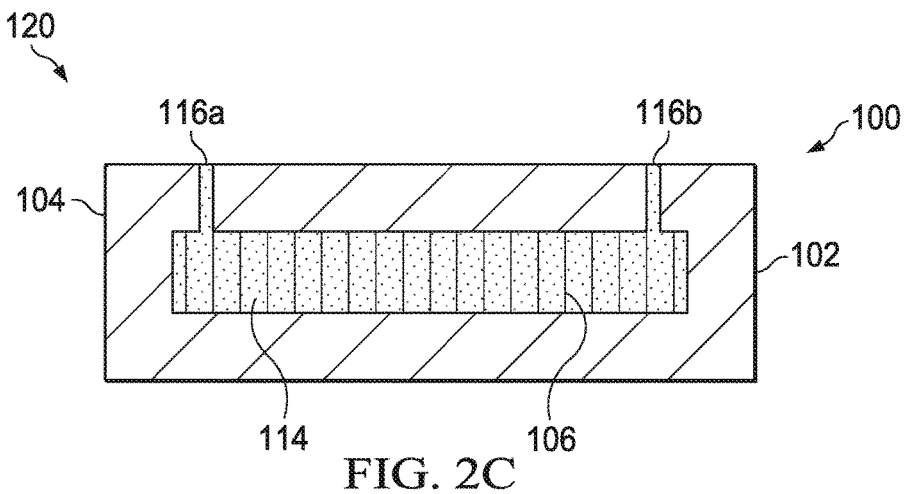

FIGS. 2A-C illustrate cross-sectional views of an example of the formation of a PCM heat sink 120 in accordance with the present disclosure. As shown in FIG. 2A, the lower shell 102, the upper shell 104 and the internal matrix 106 are formed together as a single-structure heat sink 100 using additive manufacturing techniques. The heat sink 100 also includes a fill port 108 and a vent port 110 to enable the insertion of a phase change material into open space 112 formed in the structure of the internal matrix 106.

It will be understood that the shapes of the shells 102 and 104 and the internal matrix 106 may include any suitable shapes and that the embodiment of the heat sink 100 shown in FIGS. 2A-C is for illustration only. Other embodiments of the heat sink 100 could be used without departing from the scope of this disclosure.

As shown in FIG. 2B, a phase change material 114 is introduced through the fill port 108 so as to substantially fill the space 112 within the internal matrix 106. The phase change material 114 may comprise a paraffin wax or other suitable material that absorbs thermal energy when changing from a solid state to a liquid state and releases thermal energy when changing from a liquid state to a solid state. Thus, the phase change material 114 is configured to store and release heat or thermal energy via the phase changes of the phase change material 114.

The structure of the internal matrix 106 is configured to conduct heat or thermal energy between the phase change material 114 and one or both of the shells 102 and 104. The size, spacing and geometry of the internal matrix 106 structure may be selected based on any suitable criteria, such as the thermal requirements of the application in which the PCM heat sink 120 is to be implemented. In addition, the internal matrix 106 may have any type of three-dimensional, non-symmetric and/or non-matrix design because of the additive manufacturing techniques used to form the heat sink 100.

As shown in FIG. 2C, seal plugs 116a and 116b are used to seal the ports 108 and 110, thus completing the formation of the PCM heat sink 120. The seal plugs 116a-b may include any suitable structure and may be inserted by any suitable process so as to seal the ports 108 and 110, thereby preventing the phase change material 114 from leaking out of the PCM heat sink 120. For example, for a particular embodiment, the seal plugs 116a-b may include expansion plugs. For another embodiment, the seal plugs 116a-b may include solder.

By forming the PCM heat sink 120 from a single-structure heat sink 100 generated using additive manufacturing techniques, the need for vacuum brazing is eliminated. As a result, the process to form the heat sink 100 and, thus, the PCM heat sink 120, is significantly less expensive and faster to fabricate. In addition, the robustness of the PCM heat sink 120 is increased as compared to conventionally manufactured PCM heat sinks, and complex designs may be easily implemented. Furthermore, the lower shell 102, the upper shell 104 and/or the internal matrix 106 may each include customizable, complex designs that are not possible with traditional machining techniques. This PCM heat sink 120 may be included in test hardware, commercial electronics or any other suitable application in which thermal energy needs to be managed.

Although FIGS. 2A-C illustrate one example of the formation of a PCM heat sink 120, various changes may be made to the embodiment shown in FIGS. 2A-C. For example, the makeup and arrangement of the PCM heat sink 120 are for illustration only. Components could be added, omitted, combined, subdivided, or placed in any other suitable configuration according to particular needs.

FIGS. 3A-D illustrate examples of the internal matrix 106 in accordance with the present disclosure. The examples of the internal matrix 106 shown in FIGS. 3A-D are for illustration only. Other embodiments of the internal matrix 106 could be used without departing from the scope of this disclosure. For these examples, the internal matrix 106 comprises a thermally-conductive material 302, represented by dark areas, and a space 304, represented by white areas. In addition, the internal matrix 106 is illustrated in a top view.

The thermally-conductive material 302 includes the same material as the lower and upper shells 102 and 104 of the heat sink 100 due to the additive manufacturing techniques used to form the heat sink 100 as a single structure, as described above. Because the internal matrix 106 is manufactured using additive manufacturing techniques, the thermally-conductive material 302 may be formed in any suitable configuration and is not limited to geometries that can be formed with traditional machining techniques.

Figure 3A:
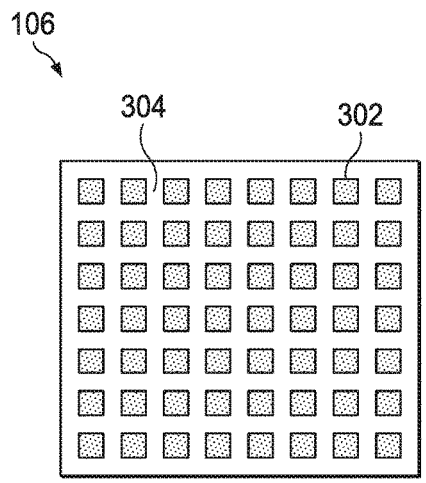
FIGS. 3A-D illustrate examples of the internal matrix of FIGS. 2A-C in accordance with the present disclosure.
Figure 3B:
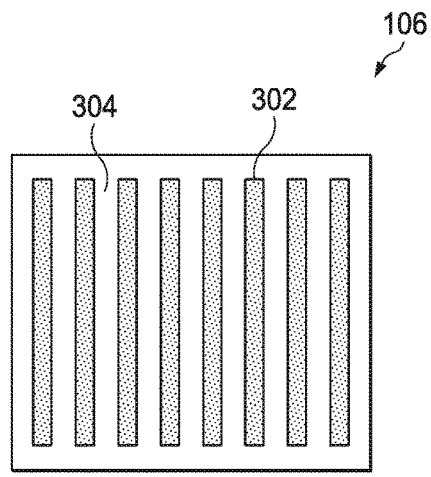
Figure 3C:
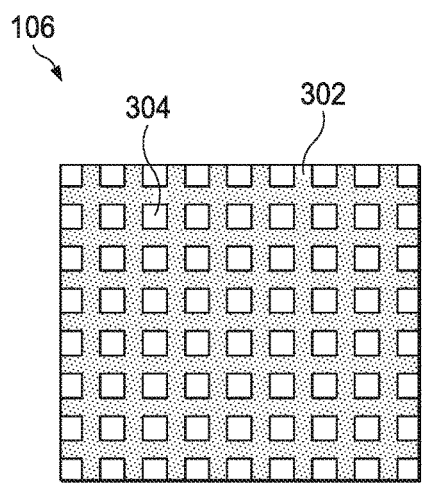
Figure 3D:
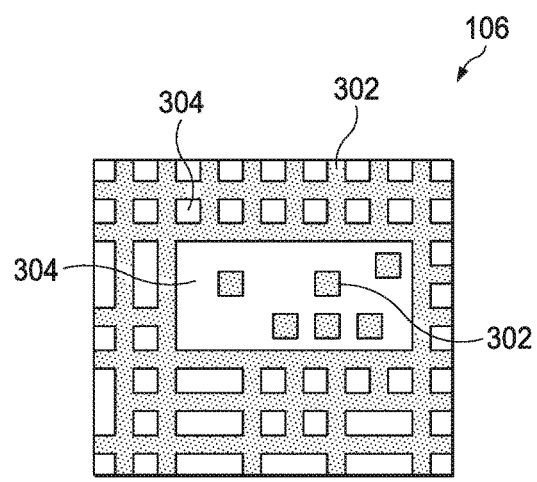

For the example shown in FIG. 3A, the thermally-conductive material 302 is configured as a plurality of pins. The space 304 comprises an open area formed by the pins. Although illustrated as square, it will be understood that the pins may alternatively be circular or any other suitable shape. For the example shown in FIG. 3B, the thermally-conductive material 302 is configured as a plurality of plates. The space 304 comprises an open area formed between the plates. Although illustrated as straight, it will be understood that the plates may alternatively be slanted, zigzag, or any other suitable shape. For the example shown in FIG. 3C, the thermally-conductive material 302 is configured as a grid. The space 304 comprises an open area formed by the grid. Although illustrated as a square grid, it will be understood that the grid may alternatively be formed in any other suitable shape. For the example shown in FIG. 3D, the thermally-conductive material 302 is configured in a non-standard shape to illustrate that the internal matrix 106 may have a complex, customized design that is tailored to meet the needs of a particular application. The space 304 in this example comprises an open area formed by the thermally-conductive material 302.

The geometry of the thermally-conductive material 302 may be as complex as desired and is not limited to the relatively simple shapes illustrated in FIGS. 3A-D. For example, the cross-section of any portion of the thermally-conductive material 302, such as pins or plates, may be constant or varying due to the additive manufacturing techniques. As a particular example, an hour-glass shaped pin or plate could be implemented. Alternatively, each pin or plate could be designed independently, with each having any desired shape. Thus, the thermally-conductive material 302 may include any suitable simple or complex three-dimensional shape, including curvatures that are not possible with traditional machining techniques. In addition, for some embodiments, localized holes (not shown in FIGS. 3A-D) may be included in the thermally-conductive material 302 to allow the phase change material to be introduced into substantially the entire open space 304 when the thermally-conductive material 302 would otherwise block its path, which may be difficult or impossible to achieve with traditional machining techniques.

Figure 4:
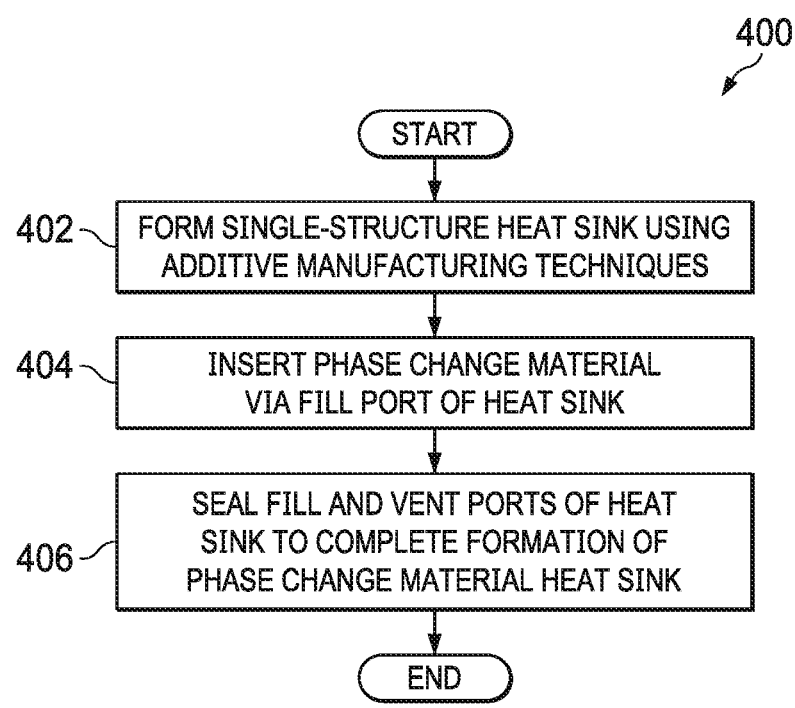
FIG. 4 is a flowchart illustrating a method for forming the PCM heat sink of FIGS. 2A-C in accordance with the present disclosure.

FIG. 4 is a flowchart illustrating a method 400 for forming the PCM heat sink 120 in accordance with the present disclosure. The method 400 shown in FIG. 4 is for illustration only. The PCM heat sink 120 may be formed in any other suitable manner without departing from the scope of this disclosure.

Initially, a single-structure heat sink 100 is formed using additive manufacturing techniques (step 402). For a particular example, for some embodiments, a lower shell 102, an upper shell 104 and an internal matrix 106 are formed as a single component. The heat sink 100 may comprise aluminum or other suitable material.

A phase change material 114 is inserted via a fill port 108 of the heat sink 100 (step 404). For a particular example, for some embodiments, the phase change material 114 is inserted such that open space 304 within the internal matrix 106 is substantially filled with the phase change material 114. The phase change material 114 may comprise a paraffin wax or other suitable material.

The fill port 108 and a vent port 110 of the heat sink 100 are sealed to complete formation of the PCM heat sink 120 (step 406). The fill port 108 and the vent port 110 may be sealed using expansion plugs or other suitable method, such as soldering.

As a result, the PCM heat sink 120 may be formed using a process that is significantly less expensive and faster as compared to conventional PCM heat sinks while providing the benefit of increased robustness. In addition, the heat sink 100 itself may be designed to optimize heat transport, maximize volume allocated for phase change material 114, and provide suitable PCM filling paths due to the use of additive manufacturing techniques in the formation of the heat sink 100.

Although FIG. 4 illustrates one example of a method 400 for forming the PCM heat sink 120, various changes may be made to the embodiment shown in FIG. 4. For example, while shown as a series of steps, various steps in FIG. 4 could overlap, occur in parallel, occur in a different order, or occur multiple times.

Modifications, additions, or omissions may be made to the apparatuses, and methods described herein without departing from the scope of the disclosure. For example, the components of the apparatuses may be integrated or separated. The methods may include more, fewer, or other steps. Additionally, as described above, steps may be performed in any suitable order.

It may be advantageous to set forth definitions of certain words and phrases used throughout this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The term "each" refers to each member of a set or each member of a subset of a set. Terms such as "over" and "under" may refer to relative positions in the figures and do not denote required orientations during manufacturing or use. Terms such as "higher" and "lower" denote relative values and are not meant to imply specific values or ranges of values. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method comprising:
using additive manufacturing techniques:
forming a structural component;
forming a lower shell of a heat sink;
forming an internal matrix of the heat sink, the internal matrix comprising a plurality of parallel pins arranged in a grid pattern; and
forming an upper shell of the heat sink,
wherein the lower shell, the internal matrix, and the upper shell of the heat sink comprise a single-structure component that is incorporated into the structural component, such that the heat sink and the structural component are integral.

2. The method of claim 1, further comprising, using additive manufacturing techniques, forming a fill port and a vent port in the upper shell of the heat sink.

3. The method of claim 2, further comprising inserting a phase change material into the heat sink via the fill port.

4. The method of claim 3, wherein the phase change material comprises a paraffin wax, and wherein the lower shell, the internal matrix and the upper shell comprise a thermally-conductive material.

5. The method of claim 3, wherein the internal matrix further comprises a space, wherein inserting the phase change material comprises substantially filling the space of the internal matrix with the phase change material, and wherein fon ling the internal matrix comprises forming the internal matrix to optimize heat transfer into the phase change material.

6. The method of claim 3, further comprising sealing the fill port and the vent port with seal plugs to form a phase change material heat sink.

7. The method of claim 6, wherein the seal plugs comprise expansion plugs.

8. The method of claim 1, wherein the plurality of parallel pins comprise hour-glass shaped pins.

9. The method of claim 1, wherein the structural component comprises an airframe or a bulkhead.

10. A method comprising:
using additive manufacturing techniques:
forming a structural component;
forming a lower shell of a heat sink;
forming an internal matrix of the heat sink, the internal matrix comprising a plurality of parallel plates; and
forming an upper shell of the heat sink,
wherein the lower shell, the internal matrix, and the upper shell of the heat sink comprise a single-structure component that is incorporated into the structural component, such that the heat sink and the structural component are integral.

11. The method of claim 10, further comprising, using additive manufacturing techniques, forming a fill port and a vent port in the upper shell of the heat sink.

12. The method of claim 11, further comprising inserting a phase change material into the heat sink via the fill port.

13. The method of claim 12, wherein the phase change material comprises a paraffin wax, and wherein the lower shell, the internal matrix and the upper shell comprise a thermally-conductive material.

14. The method of claim 12, wherein the internal matrix further comprises a space, wherein inserting the phase change material comprises substantially filling the space of the internal matrix with the phase change material, and wherein forming the internal matrix comprises forming the internal matrix to optimize heat transfer into the phase change material.

15. The method of claim 12, wherein the internal matrix further comprises a second plurality of parallel plates perpendicular to the plurality of parallel plates.

16. The method of claim 12, further comprising sealing the fill port and the vent port with seal plugs to form a phase change material heat sink.

17. The method of claim 16, wherein the seal plugs comprise expansion plugs.

18. A method comprising:
  forming a structural component, a lower shell of a heat sink, an internal matrix of the heat sink, and an upper shell of the heat sink using additive manufacturing techniques, wherein the lower shell, the internal matrix, and the upper shell of the heat sink comprise a single-structure component that is incorporated into the structural component, such that the heat sink and the structural component are integral, wherein the internal matrix comprises a plurality of parallel plates or a plurality of parallel pins;
  using additive manufacturing techniques, forming a fill port and a vent port in the upper shell of the heat sink;
  inserting a phase change material into the heat sink via the fill port; and
  sealing the fill port and the vent port with seal plugs.

19. The method of claim 18, wherein the seal plugs comprise expansion plugs.

20. The method of claim 18, wherein the phase change material comprises a paraffin wax, and wherein the lower shell, the internal matrix and the upper shell comprise a thermally-conductive material.

21. The method of claim 18, wherein the internal matrix further comprises a space, wherein inserting the phase change material comprises substantially filling the space of the internal matrix with the phase change material, and wherein for ling the internal matrix comprises foaming the internal matrix to optimize heat transfer into the phase change material.

* * * * *